(12) United States Patent
Hata

(10) Patent No.: US 10,439,545 B2
(45) Date of Patent: Oct. 8, 2019

(54) CONTROL APPARATUS AND CONTROL METHOD

(71) Applicant: Toyota Jidosha Kabushiki Kaisha, Toyota-shi, Aichi-ken (JP)

(72) Inventor: Keisuke Hata, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 16/173,208

(22) Filed: Oct. 29, 2018

(65) Prior Publication Data

US 2019/0140576 A1    May 9, 2019

(30) Foreign Application Priority Data

Nov. 8, 2017    (JP) .................................. 2017-215803

(51) Int. Cl.
*G01R 31/02* (2006.01)
*H02H 3/04* (2006.01)
(Continued)

(52) U.S. Cl.
CPC .......... *H02P 29/024* (2013.01); *B60L 3/0038* (2013.01); *B60L 3/0084* (2013.01);
(Continued)

(58) Field of Classification Search
CPC ........................... H02P 29/024; H02P 29/0241
(Continued)

(56) References Cited

U.S. PATENT DOCUMENTS

2007/0016337 A1* 1/2007 Iwagami ................. B60R 16/03
701/1
2008/0309163 A1* 12/2008 Hashimoto ........... H02J 7/0029
307/31
(Continued)

FOREIGN PATENT DOCUMENTS

JP    H08336243 A    12/1996
JP    2013-095238 A    5/2013
(Continued)

OTHER PUBLICATIONS

Joe Chong et al., "Managing Multiple Supply Voltages", Power Electronics, Aug. 1, 2004 URL: https://www.powerelectronics.com/content/managing-multiple-supply-voltages.
(Continued)

*Primary Examiner* — Erick D Glass
(74) *Attorney, Agent, or Firm* — Dinsmore & Shohl LLP

(57) ABSTRACT

In a control apparatus including a drive unit, first and second power supplies, a first diode, first and second control units, and a control method of the control apparatus, the first diode is connected to first and second power lines such that a direction from the second power line to the first power line is set as a forward direction, the second control unit is configured to calculate correction information for a first state value based on the voltage of the first power line before and after an abnormality has occurred in the first power supply and to transmit the correction information to the first control unit when the abnormality has occurred in the first power supply, and the first control unit is configured to correct the first state value using the correction information when the correction information has been received from the second control unit.

8 Claims, 4 Drawing Sheets

(51) Int. Cl.
*H02H 7/08* (2006.01)
*H02P 29/024* (2016.01)
*G01R 19/00* (2006.01)
*G01R 19/257* (2006.01)
*G01R 19/165* (2006.01)
*B60W 50/023* (2012.01)
*B60L 3/00* (2019.01)
*H02M 1/00* (2006.01)
*H02M 1/32* (2007.01)

(52) U.S. Cl.
CPC ......... *B60L 3/0092* (2013.01); *B60W 50/023* (2013.01); *G01R 19/0038* (2013.01); *G01R 19/16523* (2013.01); *G01R 19/257* (2013.01); *H02P 29/0241* (2016.02); *H02M 2001/0012* (2013.01); *H02M 2001/325* (2013.01)

(58) Field of Classification Search
USPC ........................................................ 318/490
See application file for complete search history.

(56) References Cited

U.S. PATENT DOCUMENTS

| | | |
|---|---|---|
| 2011/0241913 A1 | 10/2011 | Ikeda et al. |
| 2011/0266984 A1 | 11/2011 | Watanabe et al. |
| 2013/0106174 A1 | 5/2013 | Uchida |
| 2016/0347326 A1 | 12/2016 | Iwagami et al. |

FOREIGN PATENT DOCUMENTS

| | | |
|---|---|---|
| JP | 2016-223372 A | 12/2016 |
| JP | 2017-118314 A | 6/2017 |

OTHER PUBLICATIONS

Dirk Gehrke et al., "Point-of-Load: One for All", EE Times, Feb. 17, 2010.

\* cited by examiner

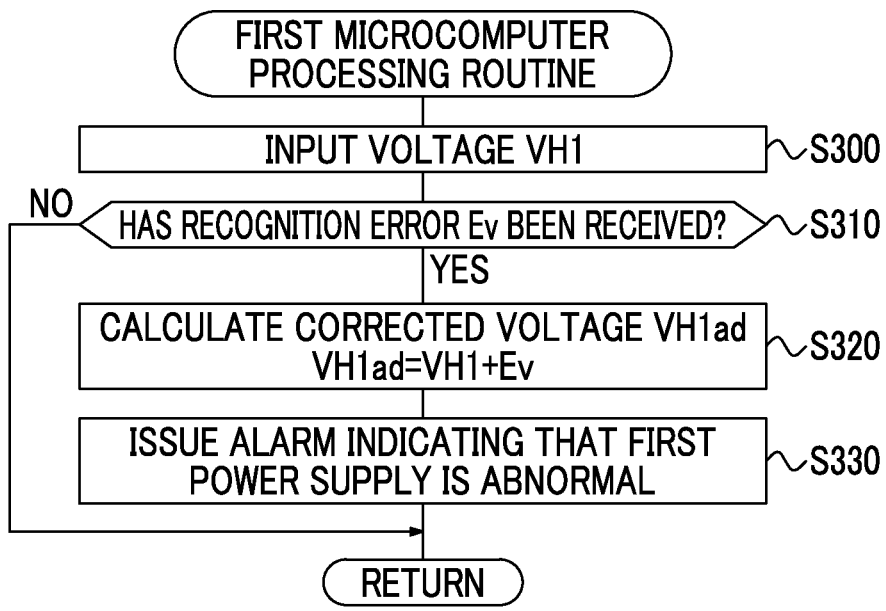
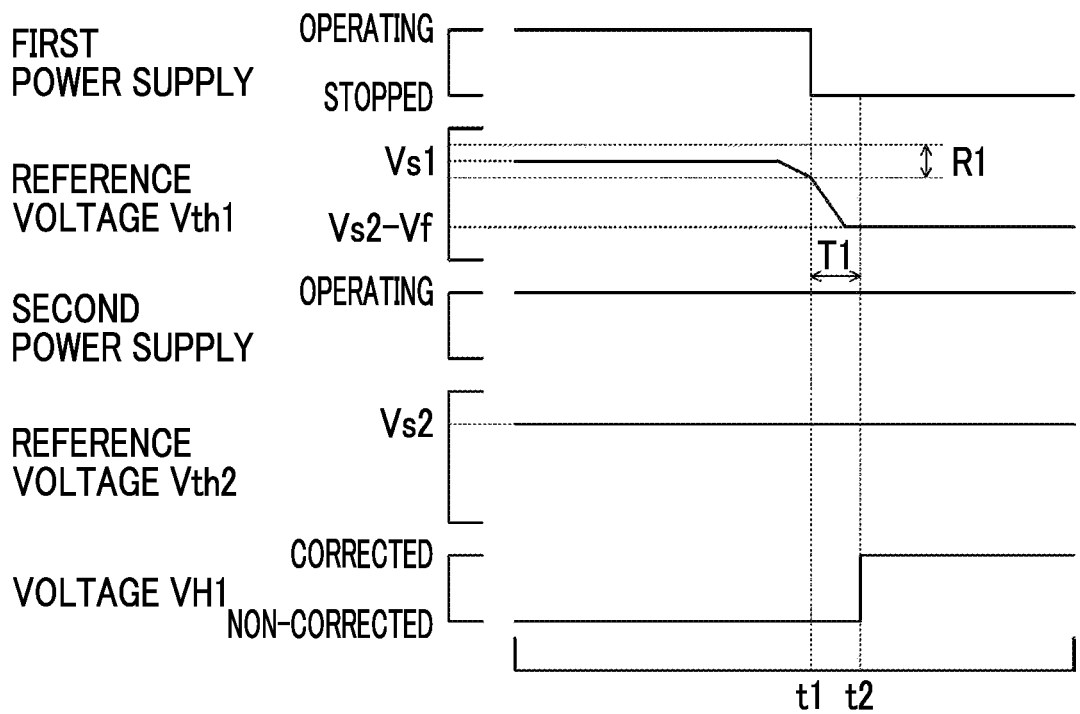

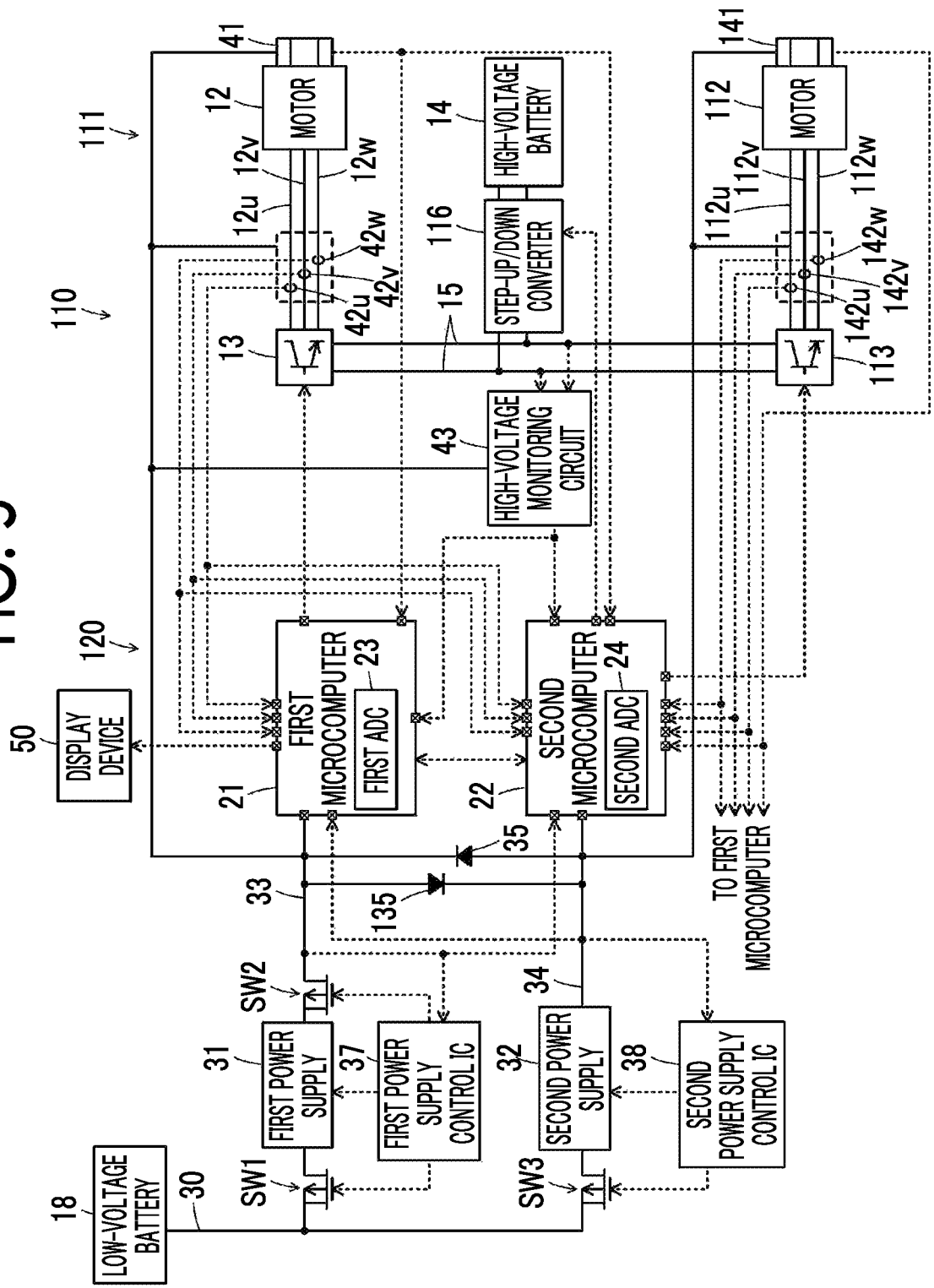

CONTROL APPARATUS AND CONTROL METHOD

CROSS-REFERENCE TO RELATED APPLICATIONS

This application claims priority to Japanese Patent Application No. 2017-215803 filed on Nov. 8, 2017, which is incorporated herein by reference in its entirety.

BACKGROUND

1. Technical Field

The disclosure relates to a control apparatus and a control method of the control apparatus, and more particularly, to a control apparatus including two control units and a control method of the control apparatus.

2. Description of Related Art

In the related art, a control apparatus including a first control circuit and a second control circuit has been proposed as a control apparatus including two control units (for example, see Japanese Unexamined Patent Application Publication No. 2016-223372 (JP 2016-223372 A)). Here, each of the first control circuit and the second control circuit includes a CPU, a program memory, a data memory, a RAM, and an AD conversion unit.

SUMMARY

Recently, a control apparatus including a first power supply and a second power supply that supply a first voltage and a second voltage to a first control circuit and a second control circuit in addition to the first and second control circuits has been conceived. Here, a first AD conversion unit and a second AD conversion unit of the first and second control circuits convert an analog value from sensors attached to a detection object of a drive unit into first and second digital values using the first and second voltages as a first reference voltage and a second reference voltage, and the first and second control circuits calculate a first state value and a second state value of the detection object based on the first and second digital values. In such a control apparatus having the above-mentioned configuration, even if an abnormality occurs in the first power supply (when the first reference voltage changes), there is a requirement for causing the first control circuit to recognize the first state value as a more appropriate value.

The disclosure provides a control apparatus which includes a first power supply, a second power supply, a first control unit, and a second control unit. And the disclosure provide the control apparatus and a control method of the control apparatus which enable the first control unit to recognize a first state value as a more appropriate value even when an abnormality occurs in the first power supply. Here, the first and second control units include first and second conversion units that convert an analog value from a sensor attached to a detection object into first and second digital values and are configured to calculate first and second state values of the detection object based on the first and second digital values. The first and second power supplies are configured to supply first and second voltages to the first and second control units, respectively.

Therefore, according to a first aspect of the disclosure, there is provided a control apparatus including a first power supply, a second power supply, a first diode, a first control unit, and a second control unit. The first control unit includes a first conversion unit configured to convert an analog value from a sensor attached to a detection object of a drive unit into a first digital value using the voltage of the first power line as a first reference voltage and a first control unit being configured to calculate a first state value of the detection object based on the first digital value. The second control unit includes a second conversion unit configured to convert the analog value into a second digital value using the voltage of the second power line as a second reference voltage and a second control unit being configured to calculate a second state value of the detection object based on the second digital value. The second control unit is configured to monitor the voltage of the first power line and to calculate correction information for the first state value based on the voltage of the first power line before and after an abnormality has occurred in the first power supply and to transmit the calculated correction information to the first control unit when the abnormality has occurred in the first power supply. The first control unit is configured to correct the first state value using the correction information when the correction information has been received from the second control unit.

The control apparatus according to the first aspect of the disclosure includes the first power supply, the second power supply, the first control unit, and the second control unit. The first control unit includes the first conversion unit that converts an analog value from a sensor attached to a detection object of the drive unit into a first digital value using the voltage of the first power line as the first reference voltage and is configured to calculate the first state value of the detection object based on the first digital value. The second control unit includes the second conversion unit that converts the analog value from the sensor into a second digital value using the voltage of the second power line as the second reference voltage and is configured to calculate the second state value of the detection object based on the second digital value. The first power supply is configured to supply a first voltage to a first power line. The second power supply is configured to supply a second voltage to a second power line. The first diode is connected to the first power line and the second power line such that a direction from the second power line to the first power line is set as a forward direction. The second control unit is configured to monitor the voltage of the first power line and to calculate correction information for the first state value based on the voltage of the first power line before and after an abnormality has occurred in the first power supply and to transmit the calculated correction information to the first control unit when the abnormality has occurred in the first power supply. The first control unit is configured to correct the first state value using the correction information when the first control unit has received the correction information from the second control unit. When an abnormality has occurred in the first power supply and the first voltage is not supplied from the first power supply to the first power line, the voltage of the first power line (the first reference voltage) changes form the first voltage to a voltage which is lower than the second voltage by the forward voltage of the first diode. Accordingly, before and after the abnormality has occurred in the first power supply, the analog value is the same, but the first digital value varies and the first state value varies. Accordingly, when an abnormality has occurred in the first power supply, the second control unit calculates the correction information for the first state value and transmits the correction information to the first control unit and the first control unit corrects the first state value using the correction information from the second control unit, whereby the first control unit can recognize the first state value (the corrected first state value) of the detection object as a more appropriate value.

Here, an example of the "drive unit" is a unit that drives a motor using an inverter with electric power from a battery. Examples of the "sensor" include a resolver that is attached to a rotation shaft of a motor, current sensors that are attached to power lines according to phases of a motor, a voltage sensor (a voltage monitoring circuit) that is attached to a power line connecting an inverter and a battery, a motor temperature sensor that is attached to a motor, an inverter temperature sensor that is attached to an inverter, and a coolant sensor that is attached to a circulation passage of a coolant in a cooling device that cools a motor or an inverter. Examples of the "first and second state values" include a rotational position of a rotor of a motor, phase currents according to phases of a motor, a voltage of a power line connecting an inverter and a battery, a motor temperature, an inverter temperature, and a coolant temperature. For example, "calculation of the first and second state values of a detection object based on the first and second digital values" can be performed by multiplying the first and second digital values by first and second coefficients.

In the control apparatus according to the first aspect of the disclosure, the second control unit may be configured to generate the correction information based on the voltage of the first power line before and after an abnormality has occurred in the first power supply, the second state value, and the number of bits of the first digital value when the abnormality has occurred in the first power supply.

In the control apparatus according to the first aspect of the disclosure, the second control unit may be configured: (i) to calculate a normality weight of a least significant bit of the first digital value before an abnormality has occurred in the first power supply based on the voltage of the first power line and the number of bits before the abnormality has occurred in the first power supply when the abnormality has occurred in the first power supply; (ii) to calculate an abnormality weight of the least significant bit of the first digital value after the abnormality occurs in the first power supply based on the voltage of the first power line and the number of bits after the abnormality occurs in the first power supply and to calculate a recognition error for the first state value as the correction information as a product of the second state value and a value obtained by subtracting the abnormality weight from the normality weight; and (iii) to transmit the recognition error to the first control unit. The first control unit may be configured to correct the first state value by adding the recognition error to the first state value when the recognition error has been received from the second control unit. According to this control apparatus, it is possible to more appropriately calculate correction information (a recognition error) when an abnormality has occurred in the first power supply.

The control apparatus according to the first aspect of the disclosure may further include a power supply control unit configured to control the first power supply. The power supply control, unit may be configured to determine that an abnormality has occurred in the first power supply and to stop driving of the first power supply when the voltage of the first power line has departed from an allowable range. The second control unit may be configured to use the voltage of the first power line when one of a first condition, a second condition, and a third condition has been satisfied as a voltage after an abnormality has occurred in the first power supply. Here, the first condition may be a condition that a predetermined time has elapsed after the voltage of the first power line has departed from the allowable range. The second condition may be a condition that the voltage of the first power line has reached a voltage which is lower by a forward voltage of the first diode than the voltage of the second power line after the voltage of the first power line has departed from the allowable range. The third condition may be a condition that a second predetermined time has elapsed after driving of the first power supply has been stopped. According to this control apparatus, a stable voltage in the vicinity of a voltage lower than the second voltage by the forward voltage of the first diode can be used as the voltage after an abnormality has occurred in the first power supply.

In the control apparatus according to the first aspect of the disclosure, the first control unit may be configured: (i) to control the drive unit using the first state value based on the first digital value when an abnormality has not occurred in the first power supply; and (ii) to control the drive unit using a corrected first state value obtained by correcting the first state value based on the first digital value using the correction information when an abnormality has occurred in the first power supply. According to this control apparatus, it is possible to control the drive unit even when an abnormality has occurred in the first power supply.

The control apparatus according to the first aspect of the disclosure may further include an alarm configured to issue an alarm indicating an abnormality of the first power supply when an abnormality has occurred in the first power supply. According to this control apparatus, it is possible to notify an operator (a driver), that is to cause an operator to recognize, that an abnormality has occurred in the first power supply.

The control apparatus according to the first aspect of the disclosure may further include a second diode connected to the first power line and the second power line such that a direction from the first power line to the second power line is set as a forward direction. The first control unit may be configured: (i) to monitor the voltage of the second power line; (ii) to calculate second correction information for the second state value based on the voltage of the second power line before and after an abnormality has occurred in the second power supply when the abnormality has occurred in the second power supply; and (iii) to transmit the second correction information to the second control unit. The second control unit may be configured to correct the second state value using the second correction information when the second correction information has been received from the first control unit. According to this control apparatus, even when an abnormality has occurred in the second power supply, the second control unit can recognize the second state value (the corrected second state value) of the detection object as a more appropriate value.

According to a second aspect of the disclosure, there is provided a control method of a control apparatus including a first power supply, a second power supply, and a first diode. The first power supply is configured to supply a first voltage to a first power line disposed in the control apparatus. The second power supply is configured to supply a second voltage to a second power line disposed in the control apparatus. The first diode is connected to the first power line and the second power line such that a direction from the second power line to the first power line is set as a forward direction. The control method includes: (i) converting an analog value from a sensor attached to a detection object of a drive unit into a first digital value using the voltage of the first power line as a first reference voltage; (ii) calculating a first state value of the detection object based on the first digital value; (iii) converting the analog value into a second digital value using the voltage of the second power line as a second reference voltage; (iv) calculating a second state value of the detection object based on the second digital value; (v) monitoring the voltage of the first power line and calculating correction information for the first state value based on the voltage of the first power line before and after an abnormality has occurred in the first power supply when the abnormality has occurred in the first power supply; and (vi) correcting the first state value using the correction information.

With the above-mentioned control method of a control apparatus, it is possible to calculate a first state value (a corrected first state value) of a detection object as a more appropriate value by calculating correction information for the first state value and correcting the first state value using the correction information when an abnormality occurs in the first power supply.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 3 is a flowchart illustrating an example of a first microcomputer processing routine which is performed by a first microcomputer;

FIG. 4 is a diagram illustrating an example of whether first and second power supplies are operating, a reference voltage, and whether to correct a voltage of a power line (to calculate a corrected voltage); and FIG. 5 is a diagram schematically illustrating a configuration of a drive system according to a modified example.

DETAILED DESCRIPTION OF EMBODIMENTS

Hereinafter, an aspect of the disclosure will be described with reference to an embodiment.

Figure 1:
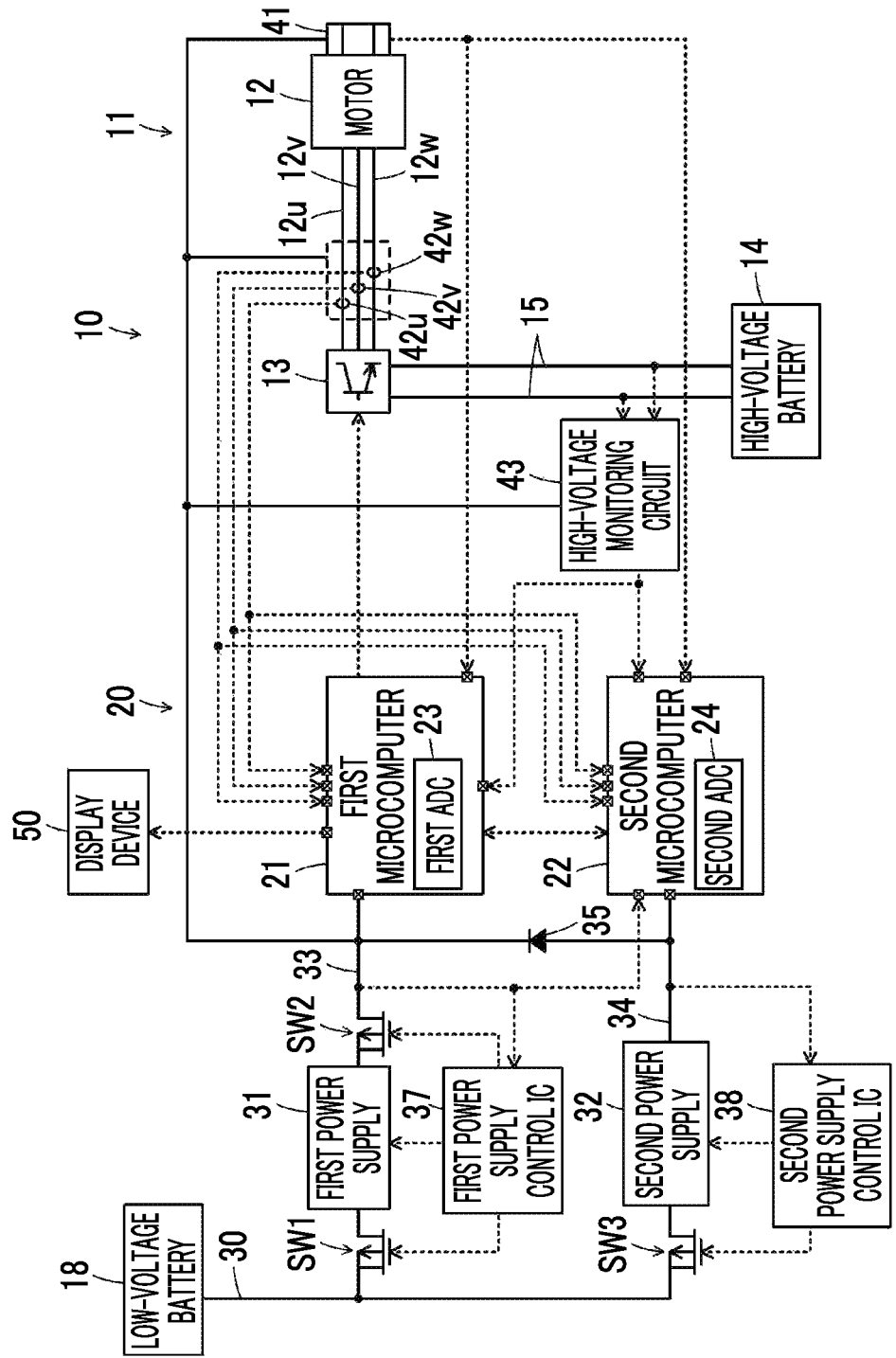
FIG. 1 is a diagram schematically illustrating a configuration of a drive system including a control apparatus according to an embodiment of the disclosure.

FIG. 1 is a diagram schematically illustrating a configuration of a drive system 10 including a control apparatus according to an embodiment of the disclosure. The drive system 10 is mounted in an electric vehicle, a hybrid vehicle, or the like and includes a drive unit 11 and an electronic control unit (ECU) 20 as the control apparatus. The ECU 20 controls the drive unit 11.

The drive unit 11 includes a running motor 12, an inverter 13 that drives the motor 12, a high-voltage battery 14 that is connected to the inverter 13 via a power line 15, and a low-voltage battery 18 that supplies electric power to the electronic control unit 20 or the like.

The motor 12 is configured as a synchronous generator motor and includes a rotor that has a permanent magnet embedded therein and a stator on which three-phase coils are wound. The inverter 13 is connected to power lines 12u, 12v, 12w of phases of the motor 12. The motor 12 is rotationally driven by causing the electronic control unit 20 (a first microcomputer 21 which will be described later) to control switching of a plurality of switching elements of the inverter 13.

The high-voltage battery 14 configured, for example, as a lithium-ion secondary battery or a nickel-hydride secondary battery with a rated voltage of 200 V, 300 V, or 400 V. The low-voltage battery 18 is configured, for example, as a lead storage battery with a rated voltage of 12 V or the like. Electric power of the power line 15 (the high-voltage battery 14) is stepped down by a DC/DC converter (not illustrated) and is then supplied to the low-voltage battery 18.

The electronic control unit 20 includes first and second microcomputers (hereinafter referred to as "microcomputers") 21, 22, first and second power supplies 31, 32, switching elements SW1 to SW3, a diode 35, and first and second power supply control ICs 37, 38.

The first power supply 31 is configured as a known switching power supply or a known series power supply, is connected to a power line 30 connected to the low-voltage battery 18 via a switching element SW1, and is connected to a power line 33 connected to the first microcomputer 21 via a switching element SW2. The first power supply 31 is controlled by a first power supply control IC 37, generates a predetermined voltage Vs1, and supplies the predetermined voltage Vs1 to the power line 33. For example, 5.0 V is used as the predetermined voltage Vs1.

The second power supply 32 is constituted as a known switching power supply or a known series power supply, is connected to the power line 30 via a switching element SW3, and is connected to a power line 34 connected to the second microcomputer 22. The second power supply 32 is controlled by a second power supply control IC 38, generates a predetermined voltage Vs2, and supplies the predetermined voltage Vs2 to the power line 34. For example, 5.0 V is used as the predetermined voltage Vs2.

The switching element SW1 is controlled by the first power supply control IC 37 and performs connection and disconnection between the power line 30 and the first power supply 31. The switching element SW2 is controlled by the first power supply control IC 37 and performs connection and disconnection between the first power supply 31 and the power line 33. The switching element SW3 is controlled by the second power supply control IC 38 and performs connection and disconnection between the power line 30 and the second power supply 32.

The diode 35 is connected to the power line 33 and the power line 34 such that a direction from the power line 34 to the power line 33 is set as a forward direction. A forward voltage Vf of the diode 35 ranges from about 0.5 V to 0.9 V.

The first power supply control IC 37 turns on the switching elements SW1, SW2 to connect the power line 30 to the first power supply 31 and to connect the first power supply 31 to the power line 33, monitors a voltage VL1 of the power line 33 in this state, and control the first power supply 31 such that the voltage VL1 of the power line 33 reaches the predetermined voltage Vs1. When the first power supply 31 is controlled and the voltage VL1 of the power line 33 gets out of an allowable range R1, the first power supply control IC 37 determines that an abnormality has occurred in the first power supply 31, stops driving of the first power supply 31, and turns off the switching elements SW1, SW2 to cut off the connection between the power line 30 and the first power supply 31 and the connection between the first power supply 31 and the power line 33. The allowable range R1 is a range centered on the predetermined voltage Vs1, and for example, a range of 4.7 V to 5.3 V is used.

The second power supply control IC 38 turns on the switching element SW3 to connect the power line 30 to the second power supply 32, monitors a voltage VL2 of the power line 34 in this state, and controls the second power supply 32 such that the voltage VL2 of the power line 34 reaches the predetermined voltage Vs2. When the second power supply 32 is controlled and the voltage VL2 of the power line 34 gets out of an allowable range R2, the second power supply control IC 38 determines that an abnormality has occurred in the second power supply 32, stops driving of the second power supply 32, and turns off the switching element SW3 to cut off the connection between the power line 30 and the second power supply 32. The allowable range R2 is a range centered on the predetermined voltage Vs2, and for example, a range of 4.7 V to 5.3 V is used.

Each of the first and second microcomputers 21 and 22 is constituted as a microprocessor including a CPU which is not illustrated and includes a ROM that stores processing programs, a RAM that temporarily stores data, a nonvolatile flash memory that stores data, input and output ports, and a communication port in addition to the CPU. The first and second microcomputers 21, 22 operate using the voltages VL1, VL2 of the power lines 33, 34, respectively. The first and second microcomputers 21, 22 are communicatively connected to each other.

Signals (analog values) from various sensors are input to the first and second microcomputers 21, 22. Examples of the signals input to the first microcomputer 21 include a signal from a resolver 41 that is attached to a rotation shaft of the motor 12, signals from current sensors $42u$, $42v$, $42w$ that are attached to power lines $12u$, $12v$, $12w$, and a signal from a high-voltage monitoring circuit 43 that is attached to a power line 15. The second microcomputer 22 monitors the voltage VL1 of the power line 33. A switching control signal to a plurality of switching elements of the inverter 13, a display control signal to a display device 50 that displays information, and the like are output from the first microcomputer 21 via the output port.

Here, the resolver 41 is constituted as a known resolver, operates using the voltage VL1 of the power line 33 as an operating voltage, converts a voltage signal (a SIN signal and a COS signal) V$\theta$a corresponding to an actual rotational position of the motor 12 into a voltage signal V$\theta$b which is a K$\theta$s multiple thereof, and outputs the converted voltage signal V$\theta$b to the first and second microcomputers 21, 22. Current sensors $42u$, $42v$, $42w$ operate using the voltage VL1 of the power line 33 as an operating voltage, convert voltage signals Via (Viau, Viav, Viaw) corresponding to actual currents of the power lines $12u$, $12v$, $12w$ into voltage signals Vib (Vibu, Vibv, Vibw) which are Kis multiples thereof, and output the converted voltage signals Vib to the first and second microcomputers 21, 22. The high-voltage monitoring circuit 43 operates using the voltage VL1 of the power line 33 as an operating voltage, converts a voltage signal Vva corresponding to an actual voltage of the power line 15 into a voltage signal Vvb which is a Kvs multiple thereof, and outputs the converted voltage signal Vvb to the first and second microcomputers 21,22.

The coefficients K$\theta$s, Kis, Kvs are determined as ratios of predetermined voltages V$\theta$set, Viset, Vvset to upper limits of allowable voltage ranges of the voltage signals V$\theta$a, Via, Vva. The predetermined voltages V$\theta$set, Viset, Vvset are upper limits of the allowable voltage ranges of the voltage signals V$\theta$b, Vib, Vvb, and are determined as voltages which are lower than the predetermined voltage Vs1 and which are lower than a voltage (Vs2−Vf) lower than the predetermined voltage Vs2 by the forward voltage. Vf of the diode 35, and for example, 4.0 V is used. The predetermined voltages V$\theta$set, Viset, Vvset may be set to the same value or may be set to different values. For example, when the allowable range of the actual voltage (the voltage signal Vva) of the power line 15 ranges from 0 V to 400 V and the predetermined voltage Vvset is 4.0 V, 0.01 is used as the coefficient Kvs. Accordingly, the high-voltage monitoring circuit 43 converts the voltage signal Vva (0 V to 400 V) into the voltage signal Vvb (0 V to 4.0 V) and outputs the converted voltage signal Vvb to the first and second microcomputers 21, 22.

The first and second microcomputers 21, 22 also includes first and second analog-digital converters (hereinafter referred to as "ADCs") 23, 24 as first and second conversion units, respectively. The first and second ADCs 23, 24 convert a signal (an analog value) from a sensor attached to a detection object of the drive system 10 into first and second digital values. The first and second microcomputers 21, 22 calculate first and second state values of the detection object based on the first and second digital values. Hereinafter, this calculation will be specifically described below.

Using the voltage VL1 of the power line 33 as a reference voltage Vth1, the first ADC 23 of the first microcomputer 21 converts the voltage signal V$\theta$b from the resolver 41 into a digital signal D$\theta$1 of N$\theta$1 bits, converts the voltage signals Vib (Vibu, Vibv, Vibw) from the current sensors $42u$, $42v$, $42w$ into digital values Di1 (Di1u, Di1v, Di1w) of Ni1 bits, or converts the voltage signal Vvb from the high-voltage monitoring circuit 43 into a digital value Dv1 of Nv1 bits. For example, eight or ten is used as the number of bits N$\theta$1, Ni1, Nv1. The number of bits N$\theta$1, Ni1, Nv1 may be set to the same value or may be set to different values. Weights of the least significant bits (LSB) of the digital values D$\theta$1, Di1, Dv1 are calculated by dividing the reference voltage Vth1 (the voltage VL1 of the power line 33) by a value obtained by subtracting 1 from the N$\theta$1-th power of 2, a value obtained by subtracting 1 from the Ni1-th power of 2, and a value obtained by subtracting 1 from the Nv1-th power of 2. The voltage VL1 of the power line 33 is basically the predetermined voltage Vs1 when the first power supply 31 is normal, and is a voltage (Vs2−Vf) lower than the predetermined voltage Vs2 by the forward voltage Vf of the diode 35 when an abnormality occurs in the first power supply 31 and driving of the first power supply 31 is stopped.

The first microcomputer 21 converts a value obtained by multiplying the digital value D$\theta$1 by a coefficient K$\theta$1 into an angle to calculate the rotational position $\theta$m1 of the rotor of the motor 12, converts a value obtained by multiplying the digital value Di1 by a coefficient Ki1 into a current to calculate phase currents Iu1, Iv1, Iw1 according to phases of the motor 12, or calculates the voltage VH1 of the power line 15 as a value obtained by multiplying the digital value Dv1 by a coefficient Kv1. The coefficient K$\theta$1 is determined as a value obtained by dividing the predetermined voltage V$\theta$set by a product of the predetermined voltage Vs1 and the coefficient K$\theta$s. The coefficient Ki1 is determined as a value obtained by dividing the predetermined voltage Viset by a product of the predetermined voltage Vs1 and the coefficient Kis. The coefficient Kv1 is determined as a value obtained by dividing the predetermined voltage Vvset by a product of the predetermined voltage Vs1 and the coefficient Kvs. For example, when the predetermined voltage Vvset is 4.0 V, the predetermined voltage Vs1 is 5.0 V, and the coefficient Kvs is 0.01, the digital value Dv1 (a digital value corresponding to 0 to the reference voltage Vth1 (the voltage VL1 of the power line 33)) is converted into the voltage VH1 (0 V to a voltage (VL1×80)) of the power line 15.

Using the voltage VL2 of the power line 34 as a reference voltage Vth2, the second ADC 24 of the second microcomputer 22 converts the voltage signal V$\theta$b from the resolver 41 into a digital signal D$\theta$2 of N$\theta$2 bits, converts the voltage signals Vib (Vibu, Vibv, Vibw) from the current sensors 42u, 42v, 42w into digital values Di2 (Di2u, Di2v, Di2w) of Ni2 bits, or converts the voltage signal Vvb from the high-voltage monitoring circuit 43 into a digital value Dv2 of Nv2 bits. For example, eight or ten is used as the number of bits Nθ2, Ni2, Nv2. The number of bits Nθ2, Ni2, Nv2 may be set to the same value or may be set to different values. Weights of the least significant bits (LSB) of the digital values Dθ2, Di2, Dv2 are calculated by dividing the reference voltage Vth2 (the voltage VL2 of the power line 34) by a value obtained by subtracting 1 from the Nθ2-th power of 2, a value obtained by subtracting 1 from the Ni2-th power of 2, and a value obtained by subtracting 1 from the Nv2-th power of 2. The voltage VL2 of the power line 34 is basically the predetermined voltage Vs2.

The second microcomputer 22 converts a value obtained by multiplying the digital value Dθ2 by a coefficient Kθ2 into an angle to calculate the rotational position θm2 of the rotor of the motor 12, converts a value obtained by multiplying the digital value Di2 by a coefficient Ki2 into a current to calculate phase currents Iu2, Iv2, Iw2 according to phases of the motor 12, or calculates the voltage VH2 of the power line 15 as a value obtained by multiplying the digital value Dv2 by a coefficient Kv2. The coefficient Kθ2 is determined as a value obtained by dividing the predetermined voltage Vθset by a product of the predetermined voltage Vs2 and the coefficient Kθs. The coefficient Ki2 is determined as a value obtained by dividing the predetermined voltage Viset by a product of the predetermined voltage Vs2 and the coefficient Kis. The coefficient Kv2 is determined as a value obtained by dividing the predetermined voltage Vvset by a product of the predetermined voltage Vs2 and the coefficient Kvs. For example, when the predetermined voltage Vvset is 4.0 V, the predetermined voltage Vs2 is 5.0 V, and the coefficient Kvs is 0.01, the digital value Dv1 (a digital value corresponding to 0 to the reference voltage Vth2 (the voltage VL2 of the power line 34)) is converted into the voltage VH2 (0 V to a voltage (VL2×80)) of the power line 15.

In the electronic control unit 20 which is mounted in the drive system 10 having the above-mentioned configuration, the first microcomputer 21 sets a torque command Tm* for the motor 12 in response to a driving request from an operator (a driver's operation of an accelerator pedal) and performs switching control of a plurality of switching elements of the inverter 13 such that the motor 12 is driven in accordance with the torque command Tm*.

Control of the inverter 13 will be described below. The first microcomputer 21 controls the inverter 13 in one control mode of a sinusoidal-wave pulse width modulation (PWM) control mode, an over-modulated PWM control mode, and a rectangular-wave control mode. The sinusoidal-wave PWM control mode is a control mode in which the inverter 13 is controlled such that pseudo-three-phase AC voltages are applied (supplied) to the motor 12. The over-modulated PWM control mode is a control mode in which the inverter 13 is controlled such that an over-modulated voltage is applied to the motor 12. The rectangular-wave control mode is a control mode in which the inverter 13 is controlled such that a rectangular-wave voltage is applied to the motor 12.

Figure 2:
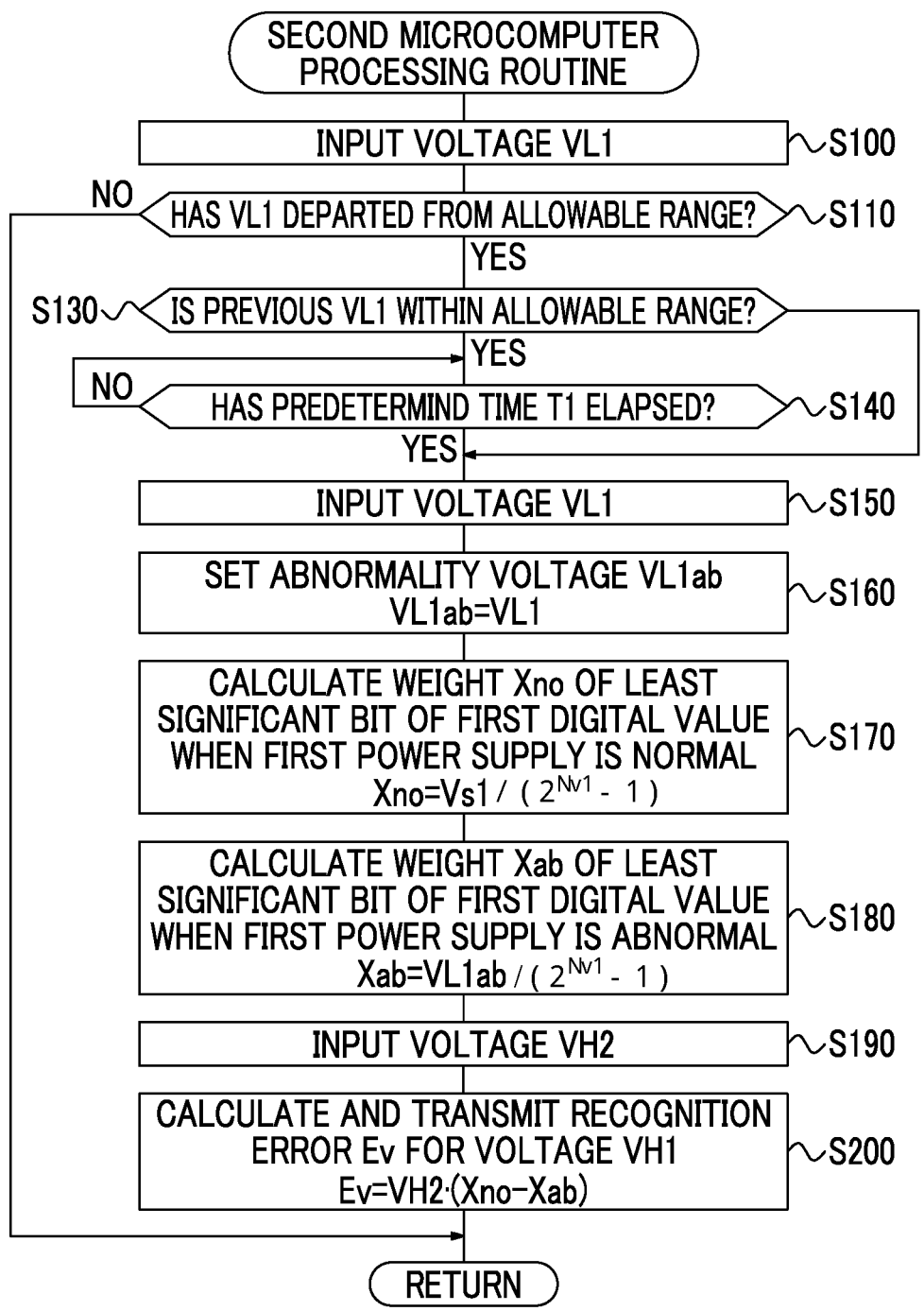
FIG. 2 is a flowchart illustrating an example of a second microcomputer processing routine which is performed by a second microcomputer.

The operation of the electronic control unit 20 that is mounted in the drive system 10, particularly, processing when the voltage of the power line 15 is recognized by the first microcomputer 21, will be described below. The same can be applied when the rotational position of the rotor of the motor 12 or the phase currents according to phases of the motor 12 are recognized. FIG. 2 is a flowchart illustrating an example of a second microcomputer processing routine which is performed by the second microcomputer 22. FIG. 3 is a flowchart illustrating an example of a first microcomputer processing routine which is performed by the first microcomputer 21. These routines are repeatedly performed. These flows will be described below.

The second microcomputer processing routine illustrated in FIG. 2 will be first described. When the second microcomputer processing routine is performed, the second microcomputer 22 receives an input of the voltage VL1 of the power line 33 (Step S100), and determines whether the input voltage VL1 of the power line 33 is within the above-mentioned allowable range R1 (Step S110). When it is determined that the voltage VL1 of the power line 33 is within the allowable range R1, the second microcomputer 22 determines that the first power supply 31 is normal and ends this routine.

When it is determined in Step S110 that the voltage VL1 of the power line 33 is out of the allowable range R1, the second microcomputer 22 determines that an abnormality has occurred in the first power supply 31 and determines whether the previous voltage (previous VL1) of the power line 33 when this routine was previously performed is within the allowable range R1 (Step S130).

Then, when it is determined that the previous voltage (previous VL1) of the power line 33 is within the allowable range R1, the second microcomputer 22 determines that the voltage VL1 of the power line 33 has just gotten out of the allowable range R1, waits for the elapse of a predetermined time T1 (Step S140), receives an input of the voltage VL1 of the power line 33 (Step S150), and sets the input voltage VL1 of the power line 33 as an abnormality voltage VL1ab which is the voltage of the power line 33 when an abnormality has occurred in the first power supply 31 (Step S160). On the other hand, when it is determined in Step S130 that the previous voltage (previous VL1) of the power line 33 is out of the allowable range R1, the second microcomputer 22 determines that this state is maintained, receives an input of the voltage VL1 of the power line 33 without waiting for the elapse of the predetermined time T1 (Step S150), and sets the input voltage VL1 of the power line 33 as an abnormality voltage VL1ab which is the voltage of the power line 33 when an abnormality has occurred in the first power supply 31 (Step S160).

When the voltage VL1 of the power line 33 gets out of the allowable range R1, the first power supply control IC 37 turns off the switching elements SW1, SW2 to cut off the connection between the power line 30 and the first power supply 31 and the connection between the first power supply 31 and the power line 33 in parallel with this routine. Then, the voltage VL1 of the power line 33 decreases due to power consumption in the first microcomputer 21, various sensors, or the like, reaches a voltage (VL2−Vf) which is lower than the voltage VL2 of the power line 34 by the forward voltage Vf of the diode 35, and is stabilized at that voltage. The predetermined time T1 is set to a time required for the voltage VL1 of the power line 33 to reach the voltage (VL2−Vf) after the voltage VL1 of the power line 33 gets out of the allowable range R1 or a time slightly longer than the time, and for example, 0.8 sec, 1 sec, or 1.2 sec is used. When the state in which the voltage VL1 of the power line 33 is out of the allowable range R1 is maintained, the voltage VL1 of the power line 33 is basically equal to the voltage (VL2−Vf) and there is a low likelihood that the voltage will change steeply. Accordingly, it is conceived that there is low necessity for waiting for the elapse of the predetermined time T1. For this reason, the processes of Steps S130 to S160 are performed.

Subsequently, the second microcomputer 22 calculates an normality weight Xno as a weight of the least significant bit (LSB) of the digital value Dv1 when the first power supply 31 is normal (Step S170) and calculates an abnormality weight Xab as a weight of the least significant bit (LSB) of the digital value Dv1 when an abnormality has occurred in the first power supply 31 (Step S180). When the first power supply 31 is normal, the reference voltage Vth1 (the voltage VL1 of the power line 33) is basically equal to the predetermined voltage Vs1 and thus the normality weight Xno is calculated by dividing the predetermined voltage Vs1 by a value obtained by subtracting 1 from the Nv1-th (the number of bits of the digital value Dv1) power of 2. The abnormality weight Xab is calculated by dividing the abnormality voltage VL1ab by a value obtained by subtracting 1 from the Nv1-th power of 2. At this time, the voltage VL1 of the power line 33 is basically equal to the voltage (Vs2−Vf). The number of bits Nv1 of the digital value Dv1 may be stored in the flash memory of the second microcomputer 22 or the like or may be acquired by communication with the first microcomputer 21.

The second microcomputer 22 receives an input of the voltage VH2 of the power line 15 which is calculated based on the digital value Dv2 (Step S190), sets a product of a value obtained by subtracting the abnormality weight Xab from the normality weight Xno and the voltage VH2 of the power line 15 as a recognition error Ev for the voltage VH1 of the power line 15 in the first microcomputer 21, transmits the recognition error Ev to the first microcomputer 21 (Step S200), and ends this routine.

The first microcomputer processing routine will be described below. When the first microcomputer processing routine is performed, the first microcomputer 21 receives an input of the voltage VH1 of the power line 15 (Step S300), determines whether a recognition error Ev for the voltage VH1 of the power line 15 has been received from the second microcomputer 22 (Step S310), does not correct the voltage VH1 of the power line 15 when the recognition error Ev for the voltage VH1 of the power line 15 has not been received from the second microcomputer 22, and ends this routine.

When it is determined in Step S310 that the recognition error Ev for the voltage VH1 of the power line 15 has been received from the second microcomputer 22, the first microcomputer 21 calculates a corrected voltage VH1ad of the power line 15 by adding the recognition error Ev to the voltage VH1 of the power line 15 input in Step S300 (Step S320), displays a message indicating that an abnormality has occurred in the first power supply 31 on the display device 50 (Step S330), and ends this routine.

As described above, the first microcomputer 21 causes the first ADC 23 to convert the voltage signal Vvb from the high-voltage monitoring circuit 43 into the digital value Dv1 of Nv1 bits using the voltage VL1 of the power line 33 as the reference voltage Vth1, and the first microcomputer 21 calculates the voltage VH1 of the power line 15 by multiplying the digital value Dv1 by the coefficient Kv1. Here, the reference voltage Vth1 (the voltage VL1 of the power line 33) is basically the predetermined voltage Vs1 when the first power supply 31 is normal, and is the voltage (Vs2−Vf) which is lower than the predetermined voltage Vs2 by the forward voltage Vf of the diode 35 when an abnormality has occurred in the first power supply 31 and driving of the first power supply 31 has been stopped. Accordingly, when the first, power supply 31 is normal and when the first power supply 31 is abnormal, the weight of the least significant bit (LSB) of the digital value Dv1 vary (the former is larger than the latter) and the voltage VH1 of the power line 15 vary (the former is larger than the latter). For example, when the upper limit of the allowable range of the actual voltage (the voltage signal Vva) of the power line 15 is 400 V, the predetermined voltage Vvset is 4.0 V, the predetermined voltages Vs1 and Vs2 are both 5.0 V, and the forward voltage Vf of the diode 35 is 0.9 V, the upper limit of the voltage VH1 (a recognized value) of the power line 15 is 400 V when the first power supply 31 is normal, is 328 V when the first power supply 31 is abnormal, and thus as an error of 72 V therebetween. In consideration of the above description, in this embodiment, when an abnormality has occurred in the first power supply 31, the second microcomputer 22 calculates the recognition error Ev for the voltage VH1 of the power line 15 in the first microcomputer 21 and transmits the recognition error Ev to the first microcomputer 21, and the first microcomputer 21 calculates the corrected voltage VH1ad by adding the recognition error Ev to the voltage VH1 of the power line 15. Accordingly, when an abnormality has occurred in the first power supply 31 and driving of the first power supply 31 has been stopped, that is, when the voltage VL1 of the power line 33 has changed, it is possible to recognize the voltage (the corrected voltage VH1ad) of the power line 15 as a more appropriate value. By displaying a message indicating that an abnormality has occurred in the first power supply 31 on the display device 50, it is possible to notify an operator thereof (to cause an operator to recognize it).

Processes for recognizing the voltage of the power line 15 have been described above, but the same can be applied when the rotational position of the rotor of the motor 12 or the phase currents according to phases of the motor 12 are recognized. Specifically, when an abnormality has occurred in the first microcomputer 21, the second microcomputer 22 calculates a recognition error Eθ for the rotational position θm1 of the rotor of the motor 12 or recognition errors Ei for the phase currents Iu1, Iv1, Iw1 according to phases in the first microcomputer 21 and transmits the calculated recognition error to the first microcomputer 21, and the first microcomputer 21 corrects the rotational position θm1 of the rotor of the motor 12 to calculate a corrected rotational position θm1ad using the recognition error Eθ and corrects the phase currents Iu1, Iv1, Iw1 according to phases to calculate corrected phase currents Iu1ad, Iv1ad, Iw1ad using the recognition errors Ei. Accordingly, it is possible to recognize the rotational position of the rotor of the motor 12 or the phase currents according to phases of the motor 12 as more appropriate values.

In this embodiment, when an abnormality has not occurred in the first power supply 31, the inverter 13 is controlled in one control mode of the sinusoidal-wave PWM control mode, the over-modulated PWM control mode, and the rectangular-wave control mode based on the rotational position θm1 of the rotor of the motor 12, the phase currents Iu1, Iv1, Iw1 according to phases, and the voltage VH1 of the power line 15. When an abnormality has occurred in the first power supply 31, the inverter 13 is controlled in one control mode of the sinusoidal-wave PWM control mode, the over-modulated PWM control mode, and the rectangular-wave control mode based on the corrected rotational position θm1ad of the rotor and the corrected phase currents Iu1ad, Iv1ad, Iw1ad according to phases of the motor 12 and the corrected voltage VH1ad of the power line 15. Accordingly, even when an abnormality has occurred in the first power supply 31, the inverter 13 can be controlled such that the motor 12 can be driven and a vehicle in which the control apparatus 10 is mounted can be made to run.

FIG. 4 is a diagram illustrating an example of whether the first and second power supplies 31, 32 are operating, the reference voltages Vth1, Vth2 (the voltages VL1, VL2 of the power lines 33, 34), and whether to correct the voltage VH1 of the power line 15 (to calculate the corrected voltage VH1ad). In FIG. 4, the predetermined voltages Vs1, Vs2 have the same value (for example, 5.0 V). As illustrated in the drawing, when the voltage VL1 of the power line 33 is within the allowable range R1 (basically the predetermined voltage Vs1) while the first power supply 31 is operating, it is determined that the first power supply 31 is normal, and the voltage VH1 of the power line 15 is not corrected. When the voltage VL1 of the power line 33 gets out of the allowable range R1 at time t1, the second microcomputer 22 starts calculation of the recognition error Ev for the voltage VH1 of the power line 15 and the first microcomputer 21 starts correction of the voltage VH1 of the power line 15 (calculation of the corrected VH1ad) using the recognition error Ev, at time t2 at which a predetermined time T1 has elapsed from time t1 (time after the voltage VL1 of the power line 33 has reached the voltage (Vs2−Vf)). Accordingly, even when an abnormality has occurred in the first power supply 31, it is possible to recognize the voltage of the power line 15 (the corrected voltage VH1ad) as a more appropriate value.

In the electronic control unit 20 according to this embodiment, the first microcomputer 21 causes the first. ADC 23 to convert the voltage signal Vvb from the, high-voltage monitoring circuit 43 into the digital value Dv1 of Nv1 bits using the voltage VL1 of the power line 33 as the reference voltage Vth1, and the first microcomputer 21 calculates the voltage VH1 of the power line 15 by multiplying the digital value Dv1 by the coefficient Kv1. When an abnormality has occurred in the first power supply 31, the second microcomputer 22 calculates the recognition error Ev for the voltage VH1 of the power line 15 and transmits the calculated recognition error Ev to the first microcomputer 21, and the first microcomputer 21 adds the recognition error Ev to the voltage VH1 of the power line 15 to calculate the corrected voltage VH1ad. Accordingly, even when an abnormality has occurred in the first power supply 31, it is possible to recognize the voltage of the power line 15 (the corrected voltage VH1ad) as a more appropriate value. The same can be applied when the rotational position of the rotor of the motor 12 or the phase currents according to phases of the motor 12 are recognized.

In the electronic control unit 20 according to this embodiment, the second microcomputer 22 sets the voltage VL1 of the power line 33 as the abnormality voltage VL1ab after a predetermined time T1 has elapsed after the voltage VL1 of the power line 33 has gotten out of the allowable range R1. However, the second microcomputer 22 may set the voltage VL1 of the power line 33 as the abnormality voltage VL1ab after the voltage VL1 of the power line 33 has reached the voltage (Vs2−Vf) after the voltage VL1 of the power line 33 has gotten out of the allowable range R1. The second microcomputer 22 may set the voltage VL1 of the power line 33 as the abnormality voltage VL1ab after a predetermined time T2 has elapsed after it has been determined that driving of the first power supply 31 has been stopped by communication with the first power supply control IC 37 or by monitoring of a signal from the first power supply control IC 37 to the first power supply 31. The second microcomputer 22 may set the voltage VL1 of the power line 33 as the abnormality voltage VL1ab after a predetermined time T3 has elapsed after it has been determined that the switching elements SW1, SW2 has been turned off by communication with the first power supply control IC 37 or by monitoring of a signal from the first power supply control IC 37 to the switching elements SW1, SW2. Here, the predetermined time T2 or the predetermined time T3 is determined as a time which is required for the voltage VL1 of the power line 33 to reach the voltage (VL2−Vf) or a time slightly longer than the time, and the same time as the predetermined time T1 or a time slightly shorter than the time is used. For example, a time which is shorter than the predetermined time T1 by a time required until it can be determined that driving of the first power supply 31 has been stopped after the voltage VL1 of the power line 33 gets out of the allowable range R1 is used as the predetermined time T2. For example, a time which is shorter than the predetermined time T1 by a time required until it can be determined that the switching elements SW1, SW2 have been turned off after the voltage VL1 of the power line 33 gets out of the allowable range R1 is used as the predetermined time T3.

In the embodiment or the above-mentioned modified examples, the second microcomputer 22 sets the voltage VL1 of the power line 33 as the abnormality voltage VL1ab when the predetermined time T1 has elapsed after the voltage VL1 of the power line 33 has gotten out of the allowable range R1, or the like. However, the second microcomputer 22 may use a voltage (Vs2−Vf) which is lower than the predetermined voltage Vs2 by the forward voltage Vf of the diode 35 as the abnormality voltage VL1ab when the predetermined time T1 has elapsed after the voltage VL1 of the power line 33 has gotten out of the allowable range R1, or the, like.

In the electronic control unit 20 according to this embodiment, the first and second ADCs 23, 24 of the first and second microcomputers 21, 22 convert a signal (an analog value) from a sensor attached to a detection object of the drive system 10 into first and second digital values, and the first and second microcomputers 21, 22 calculate state values of the detection object based on the first and second digital values. In this case, examples of the "sensor" include the resolver 41, the current sensors 42u, 42v, 42w, and the high-voltage monitoring circuit 43. Examples of the "first and second state values" include the rotational position of the rotor and the phase currents according to phases of the motor 12 and the voltage of the power line 15. The examples of the "sensor" further include a motor temperature sensor that is attached to the motor, an inverter temperature sensor that is attached to the inverter, and a coolant sensor that is attached to a circulation passage of a coolant in a cooling device that cools the motor or the inverter. The examples of the "first and second state values" further include a motor temperature, an inverter temperature, and a coolant temperature.

In the electronic control unit 20 according to this embodiment, when an abnormality has occurred in the first power supply 31, a message indicating that fact is displayed on the display device 50 to inform an operator. However, the operator may be informed by outputting voice from a speaker (not illustrated) or turning on a warning lamp (not illustrated). The operator may not be informed.

The drive system 10 includes the drive unit 11 and the electronic control unit 20. However, as illustrated in FIG. 5, a drive system 110 according to a modified example may include a drive unit 111 and an electronic control unit 120. In order to avoid repeated description, the same elements of the drive system 110 illustrated in FIG. 5 as the elements of the drive system 10 will be referred to by the same reference signs and detailed description thereof will be omitted.

The drive unit 111 of the drive system 110 includes a motor 112, an inverter 113 that drives the motor 112, and a step-up/down converter 116 that is disposed in the power line 15 in addition to the elements of the drive unit 11 of the drive system 10.

The motor 112 is constituted as a synchronous generator motor similarly to the motor 12. The inverter 113 is connected to power lines 112u, 112v, 112w according to phases of the motor 112 and is also connected to the power line 15. By causing the second microcomputer 22 of the electronic control unit 120 to control switching of a plurality of switching elements of the inverter 113, the motor 112 is rotationally driven. By causing the second microcomputer 22 to control switching of the plurality of switching elements, the step-up/down converter 116 steps up electric power on the high-voltage battery 14 side and supplies the stepped-up electric power to the inverters 13, 113 sides, or steps down electric power on the inverters 13, 113 side and supplies the stepped-down electric power to the high-voltage battery 14.

The electronic control unit 120 of the drive system 110 includes a diode 135 in addition to the elements of the electronic control unit 20 of the drive system 10. The diode 135 is connected to the power line 33 and the power line 34 such that a direction from the power line 33 to the power line 34 is set as a forward direction (in reverse parallel to the diode 35). A forward voltage Vf2 of the diode 135 ranges from about 0.5 V to 0.9 V similarly to the forward voltage Vf1 of the diode 35.

In addition to the above-mentioned various signals (the signals from the resolver 41, the current sensors 42u, 42v, 42w, the high-voltage monitoring circuit 43, and the like), a signal from a resolver 141 that is attached to a rotation shaft of the motor 112 or signals from current sensors 142u, 142v, 142w that are attached to the power lines 112u, 112v, 112w are input to the first and second microcomputers 21, 22. The first microcomputer 21 monitors the voltage VL2 of the power line 34, and the second microcomputer 22 monitors the voltage VL1 of the power line 33. As described above, a switching control signal to the plurality of switching elements of the inverter 13 or the like is output from the first microcomputer 21 via the output port. A switching control signal to the plurality of switching elements of the inverter 113, a switching control signal to the plurality of switching elements of the step-up/down converter 116, and the like are output from the second microcomputer 22 via the output port. Here, the resolver 141 or the current sensors 142u, 142v, 142w are configured in the same way as the resolver 41 and the current sensors 42u, 42v, 42w of the drive system 10.

The first and second ADCs 23, 24 of the first and second microcomputers 21, 22 convert the signals (analog values) from the resolver 141 or the current sensors 142u, 142v, 142w into digital values as well as converting the signals (analog values) from the resolver 141, the current sensors 142u, 142v, 142w, and the high-voltage monitoring circuit 43 into digital values using the voltages VL1, VL2 of the power lines 33, 34 as reference voltages Vth1, Vth2.

When the second power supply 32 is normal, the voltage VL1 of the power line 33 is basically the predetermined voltage Vs1 when the first power supply 31 is normal, and is a voltage (Vs2−Vf) which is lower than the predetermined voltage Vs2 by the forward voltage Vf of the diode 35 when an abnormality has occurred in the first power supply 31 and driving of the first power supply 31 has been stopped. When the first power supply 31 is normal, the voltage VL2 of the power line 34 is the predetermined voltage Vs2 when the second power supply 32 is normal, and is a voltage (Vs1−Vf2) which is lower than the predetermined voltage Vs1 by the forward voltage Vf2 of the diode 135 when an abnormality has occurred in the second power supply 32 and driving of the second power supply 32 has been stopped.

Based on various digital values, the first microcomputer 21 calculates rotational positions θm1, θm1a of the rotors of the motors 12, 112, calculates phase currents Iu1, Iv1, Iw1, Iu1a, Iv1a, Iw1a according to phases of the motors 12, 112, or calculates the voltage VH1 of the power line 15. Based on various digital values, the second microcomputer 22 calculates rotational positions θm2, θm2a of the rotors of the motors 12, 112, calculates phase currents Iu2, Iv2, Iw2, Iu2a, Iv2a, Iw2a according to phases of the motors 12, 112, or calculates the voltage VH2 of the power line 15.

In the electronic control unit 120 that is mounted in the drive system 110 having the above-mentioned configuration, driving of the motors 12, 112 and the step-up/down converter 116 is controlled, for example, as described below. A main electronic control unit (an electronic control unit other than the first and second microcomputers 21, 22) sets torque commands Tm* and Tma* for the motors 12, 112 in response to an operator's driving request (an operator's operation of an accelerator pedal), sets a target voltage VH* on the side of the power line 15 closer to the inverters 13, 113 (a drive system) than the step-up/down converter 116, transmits the torque command Tm* for the motor 12 to the first microcomputer 21, and transmits the torque. command Tma* for the motor 112 and the target voltage VH* of the drive system to the second microcomputer 22. The first microcomputer 21 controls switching of the plurality of switching elements of the inverter 13 such that the motor 12 is driven in accordance with the torque command Tm*. The second microcomputer 22 controls switching of the plurality of switching elements of the inverter 113 such that the motor 112 is driven in accordance with the torque command Tma* and controls switching of the plurality of switching elements of the step-up/down converter 116 such that the voltage of the drive system reaches the target voltage VH*.

In the electronic control unit 120, when an abnormality has occurred in the first power supply 31, the second microcomputer 22 calculates a recognition error Ev for the voltage VH1 of the power line 15 in the first microcomputer 21 and transmits the calculated recognition error Ev to the first microcomputer 21, and the first microcomputer 21 corrects the voltage VH1 of the power line 15 to calculate a corrected voltage VH1ad of the power line 15 using the recognition error By, as described with reference to the routine illustrated in FIG. 2 or 3. Accordingly, even when an abnormality has occurred in the first power supply 31, it is possible to recognize the voltage of the power line 15 (the corrected voltage VH1ad) as a more appropriate value. The same can be applied when the rotational position of the rotor of the motor 12 or the phase currents according to phases of the motor 12 are recognized.

Similarly, when an abnormality has occurred in the second power supply 32, the first microcomputer 21 calculates recognition errors Eθa, Eia for the rotational position θm1a of the rotor or the phase currents Iu1a, Iv1a, Iw1a according to phases of the motor 112 in the second microcomputer 22 and transmits the calculated recognition errors Eθa, Eia to the second microcomputer 22, and the second microcomputer 22 corrects the rotational position θm1a of the rotor of the motor 112 to calculate the corrected rotational position θm1aad and corrects the phase currents Iu1a, Iv1a, Iw1a according to phases of the motor 12 to calculate the corrected phase currents Iu2a, Iv2a, Iw2a using the recognition error Eθa. Accordingly, even when an abnormality has occurred in the second power supply 32, it is possible to recognize the rotational position of the rotor (the corrected rotational position θm1aad) or the phase currents (the corrected phase currents Iu2a, Iv2a, Iw2a) according to phases of the motor 112 as more appropriate values.

In the electronic control units 20, 120 mounted in the drive systems 10, 110 include the switching elements SW1 to SW3, but further include a switching element SW4 (not shown in drawings) that performs connection and disconnection between the second power supply 32 and the power line 34 and is controlled by the second power supply control IC 38 in addition to the switching elements SW1 to SW3.

Correspondence between principal elements in the embodiment and principal elements of the disclosure described in the SUMMARY will be described below. In the embodiment, the first microcomputer 21 is an example of a "first control unit." The second microcomputer 22 is an example of a "second control unit." The first power supply 31 is an example of a "first power supply." The second power supply 32 is an example of a "second power supply." The diode 35 is an example of a "diode."

The correspondence between the principal elements in the embodiment and the principal elements of the disclosure described in the SUMMARY does not limit the elements of the disclosure described in the SUMMARY, because the embodiment is an example for specifically describing an aspect of the disclosure described in the SUMMARY. That is, it should be noticed that the disclosure described in the SUMMARY has to be construed based on the description of the SUMMARY and the embodiment is only a specific example of the disclosure described in the SUMMARY.

While an embodiment of the disclosure has been described above, the disclosure is not limited to the embodiment and can be modified in various forms without departing from the gist of the disclosure.

The disclosure can be used in industries manufacturing the control apparatus.

What is claimed is:

1. A control apparatus comprising:
   a first power supply configured to supply a first voltage to a first power line;
   a second power supply configured to supply a second voltage to a second power line;
   a first diode connected to the first power line and the second power line such that a direction from the second power line to the first power line is set as a forward direction;
   a first control unit including a first conversion unit configured to convert an analog value from a sensor attached to a detection object of a drive unit into a first digital value using the voltage of the first power line as a first reference voltage, the first control unit being configured to calculate a first state value of the detection object based on the first digital value; and
   a second control unit including a second conversion unit configured to convert the analog value into a second digital value using the voltage of the second power line as a second reference voltage, the second control unit being configured to calculate a second state value of the detection object based on the second digital value,
   wherein the second control unit is configured to
   monitor the voltage of the first power line,
   calculate correction information for the first state value based on the voltage of the first power line before and after an abnormality has occurred in the first power supply, when the abnormality has occurred in the first power supply, and
   transmit the calculated correction information to the first control unit, and
   wherein the first control unit is configured to correct the first state value using the correction information when the first control unit has received the correction information from the second control unit.

2. The control apparatus according to claim 1, wherein the second control unit is configured to generate the correction information based on the voltage of the first power line before and after an abnormality has occurred in the first power supply, the second state value, and the number of bits of the first digital value, when the abnormality has occurred in the first power supply.

3. The control apparatus according to claim 2, wherein the second control unit is configured to:
   calculate a normality weight of a least significant bit of the first digital value before an abnormality has occurred in the first power supply based on the voltage of the first power line and the number of bits before the abnormality has occurred in the first power supply, when the abnormality has occurred in the first power supply;
   calculate an abnormality weight of the least significant bit of the first digital value after the abnormality occurs in the first power supply based on the voltage of the first power line and the number of bits after the abnormality occurs in the first power supply;
   calculate a recognition error for the first state value as the correction information as a product of the second state value and a value obtained by subtracting the abnormality weight from the normality weight; and
   transmit the recognition error to the first control unit, and
   wherein the first control unit is configured to correct the first state value by adding the recognition error to the first state value, when the recognition error has been received from the second control unit.

4. The control apparatus according to claim 1, further comprising a power supply control unit configured to control the first power supply,
   wherein:
   the power supply control unit is configured to, when the voltage of the first power line has departed from an allowable range, determine that an abnormality has occurred in the first power supply and stop driving of the first power supply; and
   the second control unit is configured to, when one of a first condition, a second condition, and a third condition has been satisfied as a voltage after an abnormality has occurred in the first power supply, use the voltage of the first power line, the first condition being a condition that a predetermined time has elapsed after the voltage of the first power line has departed from the allowable range, the second condition being a condition that the voltage of the first power line has reached a voltage which is lower by a forward voltage of the first diode than the voltage of the second power line after the voltage of the first power line has departed from the allowable range, the third condition being a condition that a second predetermined time has elapsed after driving of the first power supply has been stopped.

5. The control apparatus according to claim 1, wherein the first control unit is configured to:
   control the drive unit using the first state value based on the first digital value when an abnormality has not occurred in the first power supply; and control the drive unit using a corrected first state value obtained by correcting the first state value based on the first digital value using the correction information when an abnormality has occurred in the first power supply.

6. The control apparatus according to claim 1, further comprising an alarm configured to issue an alarm indicating an abnormality of the first power supply when an abnormality has occurred in the first power supply.

7. The control apparatus according to claim 1, further comprising a second diode connected to the first power line and the second power line such that a direction from the first power line to the second power line is set as a forward direction,
wherein the first control unit is configured to:
monitor the voltage of the second power line;
calculate second correction information for the second state value based on the voltage of the second power line before and after an abnormality has occurred in the second power supply when the abnormality has occurred in the second power supply; and
transmit the second correction information to the second control unit, and
wherein the second control unit is configured to correct the second state value using the second correction information when the second correction information has been received from the first control unit.

8. A control method of a control apparatus, the control apparatus including a first power supply configured to supply a first voltage to a first power line, a second power supply configured to supply a second voltage to a second power line, and a first diode connected to the first power line and the second power line such that a direction from the second power line to the first power line is set as a forward direction, the control method comprising:
converting an analog value from a sensor attached to a detection object of a drive unit into a first digital value using the voltage of the first power line as a first reference voltage;
calculating a first state value of the detection object based on the first digital value;
converting the analog value into a second digital value using the voltage of the second power line as a second reference voltage;
calculating a second state value of the detection object based on the second digital value;
monitoring the voltage of the first power line;
calculating correction information for the first state value based on the voltage of the first power line before and after an abnormality has occurred in the first power supply, when the abnormality has occurred in the first power supply; and
correcting the first state value using the correction information.

* * * * *